United States Patent
Roig-Guitart et al.

(10) Patent No.: US 10,218,350 B2
(45) Date of Patent: Feb. 26, 2019

(54) CIRCUIT WITH TRANSISTORS HAVING COUPLED GATES

(71) Applicant: SEMICONDUCTOR COMPONENTS INDUSTRIES, LLC, Phoenix, AZ (US)

(72) Inventors: Jaume Roig-Guitart, Oudenaarde (BE); Balaji Padmanabhan, Tempe, AZ (US); Prasad Venkatraman, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 308 days.

(21) Appl. No.: 15/215,310

(22) Filed: Jul. 20, 2016

(65) Prior Publication Data
US 2018/0026630 A1  Jan. 25, 2018

(51) Int. Cl.
*H03K 17/16* (2006.01)
(52) U.S. Cl.
CPC ... *H03K 17/165* (2013.01); *H03K 2217/0036* (2013.01); *H03K 2217/0054* (2013.01)
(58) Field of Classification Search
CPC ... H03K 2217/0036; H03K 2217/0054; H03K 17/165
USPC .... 327/108–112, 427, 434, 437; 326/82, 83, 326/87
See application file for complete search history.

(56) References Cited

U.S. PATENT DOCUMENTS

| | | | |
|---|---|---|---|
| 5,739,713 A | * | 4/1998 | Sharpe-Geisler ........................... H03K 19/0027 326/27 |
| 2005/0225373 A1 | | 10/2005 | Morita |
| 2007/0236274 A1 | | 10/2007 | Huang et al. |
| 2010/0271133 A1 | | 10/2010 | Bracale et al. |
| 2011/0102054 A1 | | 5/2011 | Domes |

(Continued)

FOREIGN PATENT DOCUMENTS

| CN | 1210371 A | 3/1999 |
|---|---|---|
| WO | 2000077934 A1 | 12/2000 |

OTHER PUBLICATIONS

Saito, Wataru, et al. "Switching Controllability of High Voltage GaN-HEMTs and the Cascode Connection." 2012 24th International Symposium on Power Semiconductor Devices and ICs (ISPSD), pp. 229-232. IEEE, Jun. 3-7, 2012, Bruges, Belgium.

(Continued)

*Primary Examiner* — Thomas Skibinski
(74) *Attorney, Agent, or Firm* — Abel Law Group, LLP

(57) ABSTRACT

A circuit can include a first transistor including a source and a gate; a second transistor including a drain and a gate, wherein the source of the first transistor is coupled to the drain of the second transistor; and a switchable element. In one embodiment, a first current-carrying terminal of the switchable element is coupled to the gate of the first transistor, and a second current-carrying terminal of the switchable element is coupled to the gate of the second transistor. In another embodiment, the switchable element is coupled to the gate of the first transistor and includes a first selectable terminal of the switchable element coupled to a source of the second transistor, and a second selectable terminal of the switchable element coupled to the gate of the second transistor. In a particular embodiment, the circuit can be a cascode circuit.

20 Claims, 3 Drawing Sheets

(56) References Cited

U.S. PATENT DOCUMENTS

2011/0199148 A1   8/2011   Iwamura
2013/0335134 A1   12/2013  Kanazawa et al.

OTHER PUBLICATIONS

Shimizu, Haruka, et al. "Controllability of Switching Speed and Loss for SiC JFET/Si MOSFET Cascode with External JFET Gate Resistor." 2014IEEE 26th International Symposium on Power Semiconductor Devices and ICs (ISPSD), pp. 221-224, Jun. 15-19, 2014.
Aggeler, Daniel, et al. "Dv/Dt-Control Methods for the SiC JFET/Si MOSFET Cascode." IEEE Transactions on Power Electronics, vol. 28, No. 8, Aug. 2013, pp. 4074-4082.
Haehre, Karsten, et al. "Switching Speed-Control of an Optimized Capacitor-Clamped Normally-On Silicon Carbide JFET Cascode." 15th International Power Electronics and Motion Control Conference, EPE-PEMC 2012 ECCE Europe, Novi Sad, Serbia, Sep. 4-6, 2012, pp. 1-5.
Siemieniec, Ralf., et al. "Stability and Performance Analysis of a Cascode Switch." 10th International Seminar on Power Semiconductors, Sep. 1-3, 2010, Prague, pp. 55-57.
Siemieniec, Ralf, et al. "The 1200V Direct-Driven SiC JFET Power Switch." 14th European Conference on Power Electronics and Applications (EPE), Aug. 30-Sep. 1, 2011, Birmingham, United Kingdom, pp. 1-10.

\* cited by examiner

CIRCUIT WITH TRANSISTORS HAVING COUPLED GATES

FIELD OF THE DISCLOSURE

The present disclosure relates to circuits, and more particularly to, circuits having transistors with coupled gates.

RELATED ART

Control of drain-to-source voltage as a function of time (dV/dt) can be important for electromagnetic compatibility (EMC) compliance, driver integrity in half-bridge or full-bridge topologies, and ringing effects that can produce device failure or additional power loss. Control of dV/dt can be challenging because switching-on and off of a depletion-mode high electron mobility transistor (HEMT) is by means of a floating mid-node between high-side and low-side transistors, and because small parasitic capacitances in the depletion-mode HEMT produce prominent dV/dt, such as greater than 50 V/ns. The energy losses can be significant for cascode circuits that operate at high frequencies, high voltages (e.g., power applications), or both. Further improvements in cascode circuits that allow for good dV/dt characteristics and relatively low energy losses during switching operations ($E_{SW}$) are desired.

BRIEF DESCRIPTION OF THE DRAWINGS

Embodiments are illustrated by way of example and are not limited in the accompanying figures.

Figure 1:
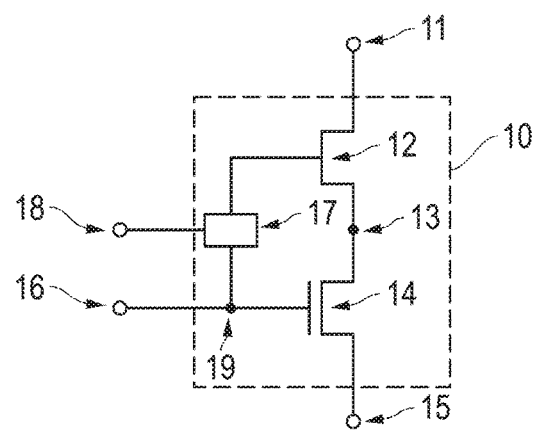
FIG. 1 includes a schematic diagram of a cascode circuit that includes a switchable element coupled between the gates of the high-side and low-side transistors of a cascode circuit.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "compound semiconductor" is intended to mean a semiconductor material that includes at least two different elements. Examples include SiC, SiGe, GaN, InP, $Al_{\nu}Ga_{(1-\nu)}N$, CdTe, and the like. A III-V semiconductor material is intended to mean a semiconductor material that includes at least one trivalent metal element and at least one Group 15 element. A III-N semiconductor material is intended to mean a semiconductor material that includes at least one trivalent metal element and nitrogen. A Group 13-Group 15 semiconductor material is intended to mean a semiconductor material that includes at least one Group 13 element and at least one Group 15 element.

The term "carrier impurity" is intended to mean (1) when an acceptor, an impurity within a compound having a different valence state as compared to at least 90% of all cations within the compound, or (2) when a donor, an impurity within a compound having a different valence as compared to at least 90% of all anions within the compound. For example, C, Mg, and Si are acceptors with respect to GaN because they can trap electrons. As used herein, Al is not a carrier impurity with respect to GaN because Al and Ga have a 3+ valence. A carrier impurity may be intentionally added or may be present as a naturally occurring impurity or as a consequence of forming a layer that includes the impurity. Acceptors and donors are carrier impurities of opposite carrier types.

Although a layer or a region may be described herein as a donor impurity type or an acceptor impurity type, skilled artisans understand that the impurity types can be reversed and are also possible in accordance with the present description.

Unless stated explicitly to the contrary, the terms "carrier impurity concentration" or "concentration of a carrier impurity", when referring to a layer, a film, or a region, is intended to mean an average concentration for such layer, film, or region.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

The terms "on," "overlying," and "over" may be used to indicate that two or more elements are in direct physical contact with each other. However, "over" may also mean that two or more elements are not in direct contact with each other. For example, "over" may mean that one element is above another element but the elements do not contact each other and may have another element or elements in between the two elements.

Group numbers corresponding to columns within the Periodic Table of Elements based on the IUPAC Periodic Table of Elements, version dated Jan. 21, 2011.

The term "normal operation" and "normal operating state" refer to conditions under which an electronic component or device is designed to operate. The conditions may be obtained from a data sheet or other information regarding voltages, currents, capacitances, resistances, or other electrical parameters. Thus, normal operation does not include operating an electrical component or device well beyond its design limits.

The term "high voltage," with reference to a layer, a structure, or a device, means that such layer, structure, or device can withstand at least 150 V difference across such layer, structure, or device (e.g., between a source and a drain of a transistor when in an off-state) without exhibiting dielectric breakdown, avalanche breakdown, or the like.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device including a cascode circuit can include a first transistor including a source and a gate; and a second transistor including a drain and a gate, wherein the source of the first transistor is coupled to the drain of the second transistor; and switchable element. In an embodiment, the switchable element includes a first current-carrying terminal and a second current carrying terminal, wherein the first current-carrying terminal of the switchable element is coupled to the gate of the first transistor, and the second current-carrying terminal of the switchable element is coupled to the gate of the second transistor. In a particular embodiment, the switchable element can include a transistor. In another embodiment, the switchable element is coupled to the gate of the first transistor and includes a first selectable terminal and a second selectable terminal, wherein the first selectable terminal of the switchable element is coupled to a source of the second transistor, and the second selectable terminal of the switchable element is coupled to the gate of the second transistor. In a particular embodiment, the switchable element can be a circuit including at least one transistor.

Cascode circuits as described herein can allow for more favorable tradeoff between dV/dt and $E_{SW}$. In a particular embodiment, for a given dV/dt, $E_{SW}$ will be lower for the cascode circuits having switchable elements coupled to the gate of the high-side transistor as compared to a conventional cascode circuit where the gate of the high-side transistor is electrically connected to the source of the low-side transistor. In a particular embodiment, the switching element includes at least one transistor and does not include a capacitor or resistor. As compared to conventional cascode circuits with additional resistors and capacitors, cascode circuits as described herein will not have timing delays or energy losses as seen with additional resistors and capacitors. Electronic devices that include exemplary cascode circuits are described below. Such exemplary cascode circuits are not intended to limit the scope of the appended claims.

FIG. 1 includes a circuit schematic of a cascode circuit 10 that includes a high-side transistor 12, a low-side transistor 14, and a switchable element 17. In an embodiment, a drain of the high-side transistor 12 is coupled to a relatively high voltage power supply terminal 11, a source of the high-side transistor 12 is coupled to a drain of the low-side transistor 14 at a mid-node 13, and a source of the low-side transistor 14 is coupled to a relatively low voltage power supply terminal 15. A gate of the high-side transistor 12 is coupled to a current-carrying terminal of the switchable element 17, and a gate of the low-side transistor 14 is coupled to another current-carrying terminal of the switchable element 17. The gate of the low-side transistor 14 can be coupled to a cascode circuit control terminal 16, which can be connected to a cascode circuit control module (not illustrated) that can include a gate driver circuit. In a particular embodiment, the gates of the transistors 12 and 14 and the cascode circuit control terminal 16 are electrically connected at a node 19. The switchable element 17 can include a control electrode that is coupled to a switch control terminal 18 that may be coupled to another part of the cascode circuit 10 or may be coupled to an external switch control module.

The switchable element 17 allows for better performance of the cascode circuit during transient portions of switching operations for the cascode circuit 10 as compared to a cascode circuit in which the gate of the high-side transistor 12 is electrically connected to the source of the low-side transistor 14. When the switchable element 17 is in a deactivated state, the gates of the transistors 12 and 14 are not connected, and thus, the Miller plateau of the circuit can be reduced. When switchable element 17 is in an activated state, the gates of the transistors 12 and 14 are connected and can reduce dV/dt by adjusting electrical impedance connected to cascode circuit control terminal 16. Thus, a better tradeoff between dV/dt and $E_{SW}$ can be achieved using the switchable element 17 between the gates of the transistors 12 and 14.

In an embodiment, each of the transistors 12 and 14 can include a depletion-mode or an enhancement-mode transistor. Each of the transistors 12 and 14 can include a compound semiconductor material (e.g., SiC, a III-V compound, or a II-VI compound), monocrystalline silicon, or diamond. The III-V compound can include III-N, III-P, III-As, and the III element may be selected from Al, Ga, In, or any combination thereof. The II-VI compound can include II-O, II-S, II-Se, or II-Te, and the II element can include Zn, Cd, Hg, Pb, or the like. In a particular embodiment, the high-side transistor 12 can include a compound semiconductor material that includes $Al_xGa_{(1-x)}N$, where $0 \leq x \leq 0.2$ or $Si_{2(1-z)}C_{2z}$, where $0 \leq z \leq 0.5$. In another particular embodiment, the low-side transistor 14 can include $Al_xGa_{(1-x)}N$, where $0 \leq x \leq 0.2$ or Si. The transistors 12 and 14 may be integrated within the same die or be within different die. In a further particular embodiment, the high-side transistor 12 is a GaN depletion-mode high electron mobility transistor (HEMT), and the low-side transistor 14 is a Si enhancement-mode metal-insulator-semiconductor field-effect transistor (MISFET). Although not illustrated in FIG. 1, the substrate of the high-side transistor 12 can be coupled to the source of the low-side transistor 14.

Figure 2:
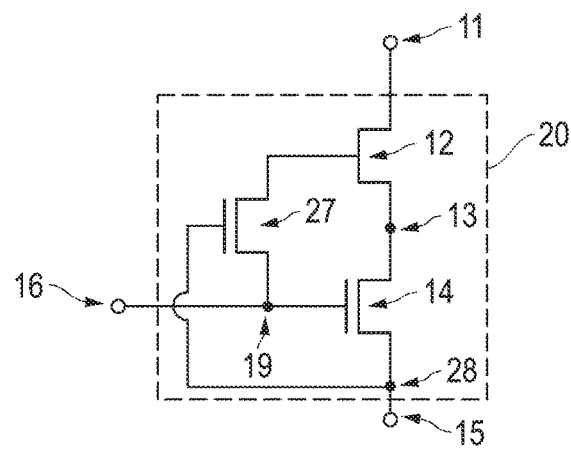
FIG. 2 includes a schematic diagram of a cascode circuit that includes a transistor coupled between the gates of the high-side and low-side transistors of a cascode circuit in accordance with an embodiment.
Figure 3:
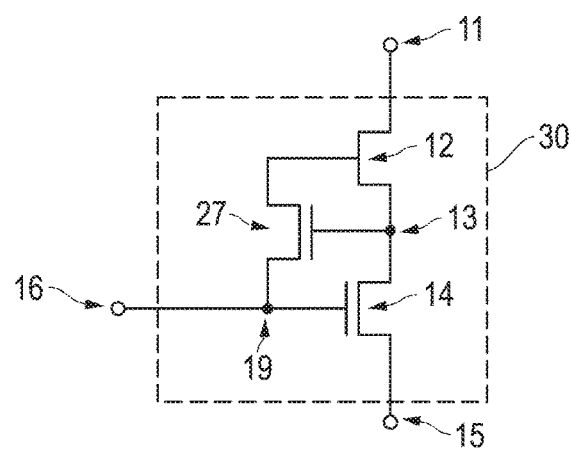
FIG. 3 includes a schematic diagram of a cascode circuit that includes a transistor coupled between the gates of the high-side and low-side transistors of a cascode circuit in accordance with another embodiment.
Figure 4:
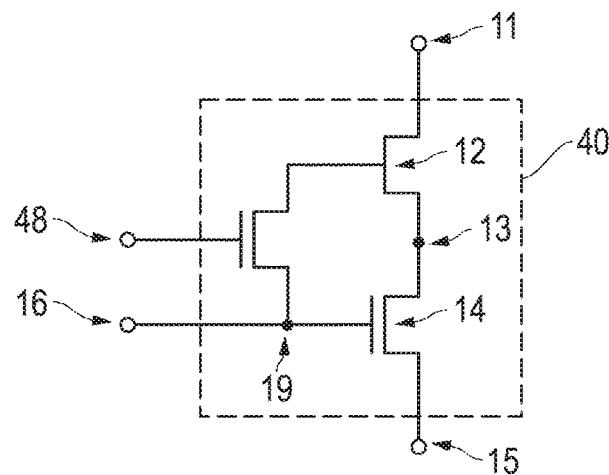
FIG. 4 includes a schematic diagram of a cascode circuit that includes a transistor coupled between the gates of the high-side and low-side transistors of a cascode circuit in accordance with a further embodiment.

The switchable element 17 can be a transistor, a relay, or the like. When the switchable element 17 is a transistor, the current-carrying terminal coupled to the gate of the high-side transistor 12 is a drain, and the current-carrying terminal coupled to the gate of the low-side transistor 14 is a source. FIGS. 2 to 4 include particular embodiments illustrating how the gate of the transistor for the switchable element 17 may be connected. The transistor for the switchable element 17 may be any of the types as previous described with respect to transistors 12 and 14. In a particular embodiment, the switchable element is a depletion-mode transistor. In a more particular embodiment, the switchable element 17 can be a GaN depletion-mode HEMT or a p-channel Si MISFET.

FIG. 2 includes a circuit schematic of a cascode circuit 20 similar to the cascode circuit 10 in FIG. 1 except that the switchable element 17 is replaced by a gate-to-gate (G2G) transistor 27. The gate of the G2G transistor 27 is coupled to the source of the low-side transistor 12 at node 28. FIG. 3 includes a circuit schematic of a cascode circuit 30 similar to the circuit 20 in FIG. 2 except that the gate of the G2G transistor 27 is coupled to the mid-node 13 instead of the node 28 (corresponding to the source of the low-side transistor 12). FIG. 4 includes a circuit schematic of a cascode circuit 40 similar to the cascode circuit 20 in FIG. 2 except that the gate of the G2G transistor 27 is coupled an external switch controller or gate driver (not illustrated) at a switch control terminal 48 instead of the node 28 (corresponding to the source of the low-side transistor 14).

Figure 5:
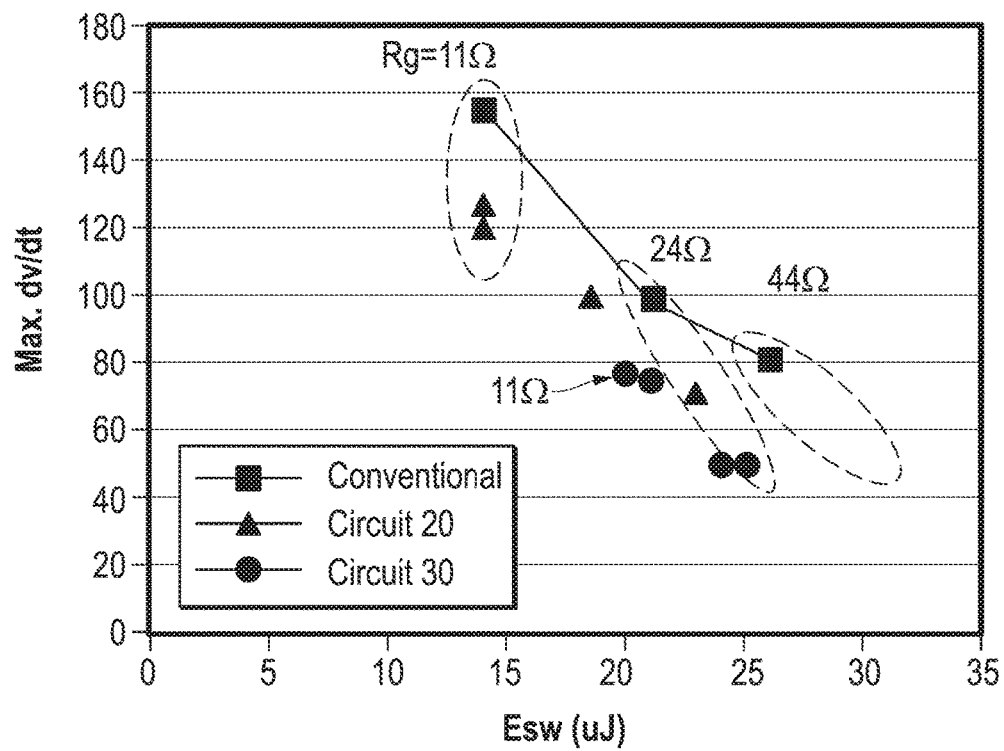
FIG. 5 includes a plot of maximum dV/dt vs. $E_{SW}$ for the circuits of FIGS. 2 and 3 as compared to a conventional cascode circuit.

FIG. 5 includes a simulated plot of maximum dV/dt as a function of energy loss during a switching operation ($E_{SW}$) for different gate resistances for the cascode circuit 20 in FIG. 2, the cascode circuit 30 in FIG. 3, and a conventional circuit similar to cascode circuit 20 except that the G2G transistor 27 is not present and the gate of the high-side transistor 12 is electrically connected to node 28. Regarding plots of maximum dV/dt versus $E_{SW}$, a curve closer to origin (0 maximum dV/dt, 0 $E_{SW}$) is preferred over a curve further from the origin. The conventional cascode circuit produces a curve has further from the origin as compared to the cascode circuit 20 in FIG. 2 and the cascode circuit 30 in FIG. 3. Thus, the cascode circuits 20 and 30 have a better tradeoff between maximum dV/dt and $E_{SW}$ as compared to the conventional cascode circuit.

Figure 6:
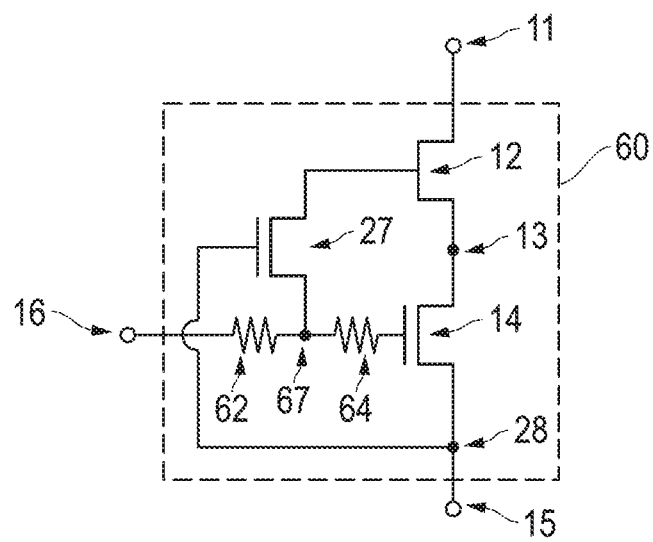
FIG. 6 includes a schematic diagram of a cascode circuit that includes a switchable element coupled between the gates of the high-side and low-side transistors of a cascode circuit, and passive components coupled to the switchable element in accordance with an embodiment.

FIG. 6 includes a circuit schematic of a cascode circuit 60 similar to the cascode circuit 20 in FIG. 2 except that passive components are added between the current-carrying terminal of the switchable element and each of the cascode control circuit terminal 16 and the gate of the low-side transistor 14. In the embodiment as illustrated in FIG. 6, the passive components are resistors 62 and 64. The resistor 62 is coupled between the cascode circuit control terminal 16 and a node 67, and the resistor 64 is coupled between the node 67 and the gate of the low-side transistor 14. In an embodiment, the resistor 62 has a greater resistance than the resistor 64. In a particular embodiment, the resistor 62 a resistance that is at least one order of magnitude or at least two orders of magnitude higher as compared to the resistor 64. In another particular embodiment, each of the resistors 62 and 64 has a resistance in a range of 0.5 ohms to 500 ohms. The particular values for the resistors 62 and 64 can be selected to tune gate delays in all of the transistors within the circuit. In a further embodiment, only one of the resistors 62 and 64 may be used.

Figure 7:
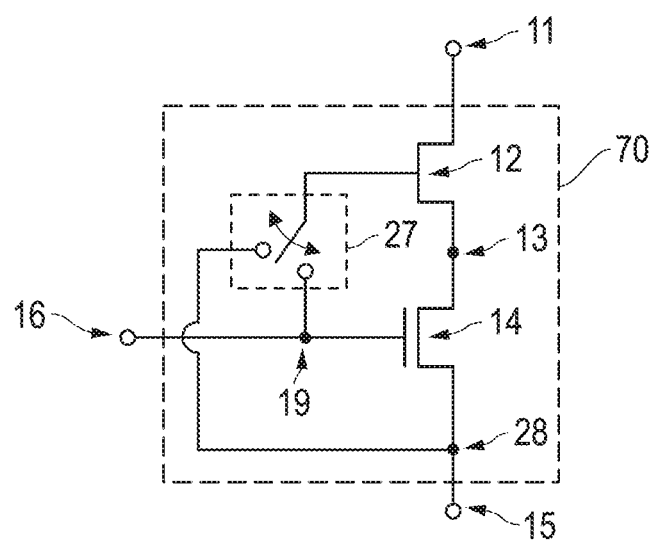
FIG. 7 includes a schematic diagram of a cascode circuit that includes a switchable element that can be selectively coupled between a gate of a high-side transistor and either of a gate or a source of a low-side transistor.

FIG. 7 illustrates an embodiment of a cascode circuit 70 in which a switchable element can be used to select whether the gate of the high-side transistor 12 is coupled to the node 28 or the cascode circuit control terminal 16. In this embodiment, the switchable element 77 replaces the switchable element 17 in FIG. 1. The switchable element 77 may receive a signal at an input terminal (not illustrated) that controls whether the gate of the high-side transistor 12 is coupled to the node 28 or the node 19.

In another embodiment, another circuit may be used for the switchable element 77. For example, the circuit may allow for the gate of the high-side transistor 12 to electrically float during a portion of the operation of the cascode circuit. The switchable element 77 may be replaced with another switchable element that allows for different signal sources for a control electrode for the switchable element. For example, such signals for the control electrode may be selected from within the cascode circuit, outside the cascode circuit, or any combination thereof. For example, the signal for the control electrode of the switchable element may be selected from any combination of at least two of the control terminal of the cascode circuit, the mid-node between the high-side and low-side transistors of the cascode circuit, the relatively high power supply terminal, relatively low power supply terminal, and the like. After reading this specification, skilled artisans will be able to determine a particular configuration for a switchable element for the gates of the high-side and low-side transistors to meet the needs or desires for a particular application.

Many of the electrical relationships between circuit elements are described as couplings. In a particular embodiment, any or all of the couplings can be the in form electrical connections. Referring to FIG. 1 for example, the drain of the high-side transistor 12 is electrically connected to the relatively high voltage power supply terminal 11, the source of the high-side transistor 12 is electrically connected to the drain of the low-side transistor 14 at the mid-node 13, and the source of the low-side transistor 14 is electrically connected to a relatively low voltage power supply terminal 15. The gate of the high-side transistor 12 is electrically connected to a current-carrying terminal of the switchable element 17, and the gate of the low-side transistor 14 is electrically connected to another current-carrying terminal of the switchable element 17. The gate of the low-side transistor 14 can be electrically connected to a cascode circuit control terminal 16, which can be connected to a cascode circuit control module (not illustrated) that can include a gate driver circuit. The circuits in other figures may be similarly modified. Furthermore, another circuit element may be inserted between circuit elements that are coupled, provided such other circuit element does not significantly affect the operation of the cascode circuit.

Embodiments of the cascode circuits as described herein have benefits over conventional cascode circuits. A switchable element between the gates of the high-side and low-side transistors allow the gate of the high-side transistor to be connected to the source of the low-side transistor during one mode of operation, and to be connected to the gate of the high-side transistor during another mode of operation. As compared to a conventional cascode circuit having the gate of the high-side transistor electrically connected to the source of the low-side transistor, the cascode circuits as described herein allow for a better tradeoff of maximum dV/dt versus $E_{SW}$. Other conventional cascode circuits can include resistor elements, capacitor elements, or combinations of resistor and capacitor elements between the gates of the high-side and low-side transistors within the cascode circuit. Such additional elements can significantly increase resistance, capacitance, or both resistance and capacitance within the circuit, slowing the operation of the circuit, and potentially further increase energy losses as excess charge may need to be dissipated. In particular embodiments described, the switchable element between the gates of the high-side and low-side transistors can allow a cascode circuit to have significantly less additional resistance and capacitance.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1

A circuit comprising:
a first transistor including a source and a gate;
a second transistor including a drain and a gate, wherein the source of the first transistor is coupled to the drain of the second transistor; and
a switchable element including a first current-carrying terminal and a second current carrying terminal, wherein the first current-carrying terminal of the switchable element is coupled to the gate of the first transistor, and the second current-carrying terminal of the switchable element is coupled to the gate of the second transistor.

Embodiment 2

The circuit of Embodiment 1, wherein the switchable element includes a third transistor that is a field-effect transistor.

Embodiment 3

The circuit of Embodiment 2, wherein the third transistor is a depletion-mode transistor.

Embodiment 4

The circuit of Embodiment 2, wherein the third transistor is a MISFET.

Embodiment 5

The circuit of Embodiment 2, wherein the first current-carrying terminal of the switchable element is a drain of the third transistor, and the second current-carrying terminal of the switchable element is a source of the third transistor.

Embodiment 6

The circuit of Embodiment 2, wherein the third transistor further includes a gate coupled to the source of the second transistor.

Embodiment 7

The circuit of Embodiment 2, wherein the third transistor further includes a gate coupled to the source of the first transistor and the drain of the second transistor.

Embodiment 8

The circuit of Embodiment 2, wherein the third transistor further includes a gate coupled to a switch controller outside the cascode circuit.

Embodiment 9

The circuit of Embodiment 2, wherein the first transistor is a depletion-mode transistor, and the second transistor is an enhancement-mode transistor.

Embodiment 10

The circuit of Embodiment 9, wherein:
the first transistor is a depletion-mode GaN HEMT;
the second transistor is an enhancement-mode Si MISFET; and
the third transistor is a depletion-mode Si MISFET or GaN HEMT.

Embodiment 11

The circuit of Embodiment 10, wherein a gate of the third transistor is electrically connected to the source of the second transistor.

Embodiment 12

The circuit of Embodiment 10, wherein a gate of the third transistor is electrically connected to the source of the first transistor and the drain of the second transistor.

Embodiment 13

The circuit of Embodiment 1, further comprising a first passive component coupled between the second current-carrying terminal of the switchable element and a control terminal of the cascode circuit or the gate of the second transistor.

Embodiment 14

The circuit of Embodiment 13, further comprising a second passive component, wherein the first passive component is coupled between the second current-carrying terminal of the switchable element and the control terminal of the cascode circuit; and the second passive component is coupled between the second current-carrying terminal of the switchable element and the gate of the second transistor.

Embodiment 15

The circuit of Embodiment 14, wherein the first passive component is a first resistor having a first resistance, the second passive component is a second resistor having a second resistance that is greater than the first resistance.

Embodiment 16

The circuit of Embodiment 14, wherein a substrate of the first transistor is coupled to the source of the second transistor.

Embodiment 17

A circuit comprising:
a first transistor including a source and a gate;
a second transistor including a drain, a source, and a gate, wherein the source of the first transistor is coupled to the drain of the second transistor; and
a switchable element coupled to the gate of the first transistor and including a first selectable terminal and a second selectable terminal, wherein the first selectable terminal of the switchable element is coupled to the source of the second transistor, and the second selectable terminal of the switchable element is coupled to the gate of the second transistor.

Embodiment 18

The circuit of Embodiment 17, wherein the electronic device is configured such that in a first state, the gate of the first transistor is coupled to first selectable terminal, and in a second state, the gate of the first transistor is coupled to the second selectable terminal.

Embodiment 19

The circuit of Embodiment 18, wherein the first transistor is a depletion-mode, and the second transistor is an enhancement-mode transistor.

Embodiment 20

The circuit of Embodiment 19, wherein the first transistor is a GaN HEMT, and the second transistor is a Si transistor.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination.

Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A circuit comprising:
a first transistor including a source and a gate, wherein the first transistor is a HEMT;
a second transistor including a drain and a gate, wherein the source of the first transistor is coupled to the drain of the second transistor; and
a switchable element including a first current-carrying terminal and a second current carrying terminal, wherein the first current-carrying terminal of the switchable element is coupled to the gate of the first transistor, and the second current-carrying terminal of the switchable element is coupled to the gate of the second transistor.

2. The circuit of claim 1, wherein the switchable element includes a third transistor that is a field-effect transistor.

3. The circuit of claim 2, wherein the third transistor is a depletion-mode transistor.

4. The circuit of claim 2, wherein the third transistor is a MISFET.

5. The circuit of claim 2, wherein the first current-carrying terminal of the switchable element is a drain of the third transistor, and the second current-carrying terminal of the switchable element is a source of the third transistor.

6. The circuit of claim 2, wherein the third transistor further includes a gate coupled to the source of the first transistor and the drain of the second transistor.

7. The circuit of claim 2, wherein the third transistor further includes a gate coupled to a switch controller outside the circuit.

8. The circuit of claim 2, wherein the first transistor is a depletion-mode transistor, and the second transistor is an enhancement-mode transistor.

9. The circuit of claim 1, further comprising a first passive component coupled between the second current-carrying terminal of the switchable element and a control terminal of the circuit or the gate of the second transistor.

10. The circuit of claim 9, further comprising a second passive component, wherein:
the first passive component is coupled between the second current-carrying terminal of the switchable element and the control terminal of the circuit; and
the second passive component is coupled between the second current-carrying terminal of the switchable element and the gate of the second transistor.

11. The circuit of claim 10, wherein the first passive component is a first resistor having a first resistance, the second passive component is a second resistor having a second resistance that is greater than the first resistance.

12. The circuit of claim 10, wherein a substrate of the first transistor is coupled to the source of the second transistor.

13. The circuit of claim 1, wherein a control terminal of the circuit, the gate of the second transistor, and the second current-carrying terminal of the switchable element are electrically connected at a node.

14. The circuit of claim 13, wherein the gate of the first transistor is not electrically connected to the node.

15. The circuit of claim 1, wherein the first transistor is a depletion-mode transistor, and the second transistor is an enhancement-mode Si MISFET.

16. The circuit of claim 1, wherein:
the gate of the first transistor and the first current-carrying terminal of the switchable element are electrically connected at a first node,
a control terminal of the circuit, the gate of the second transistor, and the second current-carrying electrode of the switchable element are electrically connected at a second node.

17. A circuit comprising:
a first transistor including a source and a gate;
a second transistor including a drain and a gate, wherein the source of the first transistor is coupled to the drain of the second transistor; and
a switchable element including a gate, a first current-carrying terminal and a second current carrying terminal, wherein:
the first current-carrying terminal of the switchable element is coupled to the gate of the first transistor,
the second current-carrying terminal of the switchable element is coupled to the gate of the second transistor, and
the switchable element includes a third transistor that is a field-effect transistor, wherein a gate of the third transistor is coupled to the source of the second transistor.

18. The circuit comprising:
a first transistor including a source and a gate, wherein the first transistor is a depletion-mode GaN HEMT;
a second transistor including a drain and a gate, wherein the second transistor is an enhancement-mode Si MISFET, and the source of the first transistor is coupled to the drain of the second transistor; and
a switchable element including a first current-carrying terminal and a second current carrying terminal, wherein the switchable element is a depletion-mode Si MISFET or GaN HEMT, the first current-carrying terminal of the switchable element is coupled to the gate of the first transistor, and the second current-carrying terminal of the switchable element is coupled to the gate of the second transistor.

19. The circuit of claim 18, wherein a gate of the third transistor is electrically connected to the source of the second transistor.

20. The circuit of claim 18, wherein a gate of the third transistor is electrically connected to the source of the first transistor and the drain of the second transistor.

* * * * *